(12) United States Patent
Hoffmann et al.

(10) Patent No.: US 9,732,412 B2
(45) Date of Patent: Aug. 15, 2017

(54) GAS SYSTEM FOR REACTIVE DEPOSITION PROCESS

(75) Inventors: Gerd Hoffmann, Bruchkoebel (DE); Alexander Wolff, Kleinostheim (DE)

(73) Assignee: Applied Materials, Inc., Santa Clara, CA (US)

( * ) Notice: Subject to any disclaimer, the term of this patent is extended or adjusted under 35 U.S.C. 154(b) by 785 days.

(21) Appl. No.: 14/114,648

(22) PCT Filed: Apr. 29, 2011

(86) PCT No.: PCT/EP2011/056879
§ 371 (c)(1),
(2), (4) Date: Apr. 16, 2014

(87) PCT Pub. No.: WO2012/146312
PCT Pub. Date: Nov. 1, 2012

(65) Prior Publication Data
US 2014/0227443 A1  Aug. 14, 2014

(51) Int. Cl.
*C23C 16/00* (2006.01)
*C23C 14/24* (2006.01)
*C23C 14/00* (2006.01)
*C23C 14/56* (2006.01)

(52) U.S. Cl.
CPC ........ *C23C 14/243* (2013.01); *C23C 14/0021* (2013.01); *C23C 14/562* (2013.01); *C23C 14/564* (2013.01)

(58) Field of Classification Search
CPC .................................................... C23C 14/243
USPC .................................................. 118/726, 727
See application file for complete search history.

(56) References Cited

U.S. PATENT DOCUMENTS

| | | | |
|---|---|---|---|
| 3,356,529 A | 12/1967 | Kiser et al. | |
| 4,780,023 A | 10/1988 | Dalton | |
| 2008/0017496 A1* | 1/2008 | Thompson | C10B 7/14 201/25 |
| 2010/0075036 A1* | 3/2010 | Okazaki | C23C 14/02 427/255.5 |
| 2011/0023862 A1* | 2/2011 | Yamakage | C23C 14/243 126/344 |

FOREIGN PATENT DOCUMENTS

| | | |
|---|---|---|
| CN | 101542008 A | 9/2009 |
| DE | 102006023463 A1 | 11/2007 |
| EP | 0750056 A1 | 12/1996 |

(Continued)

OTHER PUBLICATIONS

English translation JP 2009-263740, Nagasaki, Nov. 2009.*

(Continued)

*Primary Examiner* — Keath Chen
(74) *Attorney, Agent, or Firm* — Patterson & Sheridan, LLP

(57) ABSTRACT

A gas lance unit configured for a reactive deposition process with a plurality of spaced apart crucibles, wherein spaces are provided between the crucibles, is described. The gas lance unit includes a gas guiding tube having one or more outlets for providing a gas for the reactive deposition process, and a condensate guiding element for guiding a condensate, particularly an aluminum condensate, to one or more positions above the spaces.

9 Claims, 5 Drawing Sheets

(56) References Cited

FOREIGN PATENT DOCUMENTS

JP         H11335819 A     12/1999
JP         2009-263740     * 11/2009   ............. C23C 14/24

OTHER PUBLICATIONS

English translation DE 102006023463, Heinβ, Nov. 2007.*
International Search Report, PCT/EP2011/056879, Jan. 18, 2012.
Chinese Office Action dated Sep. 14, 2016 for Application No. 201180070470.X.
European Office Action dated Apr. 3, 2017 for Application No. 11716931.8.

* cited by examiner

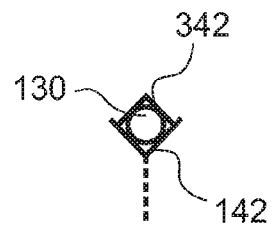 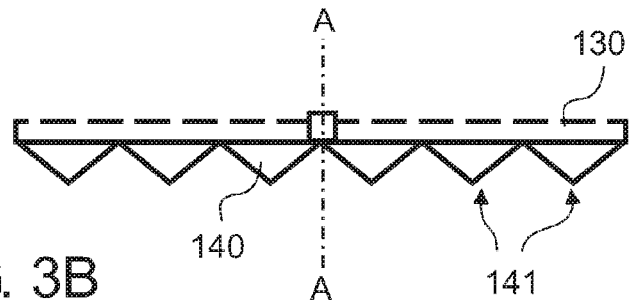
FIG. 3A  FIG. 3B
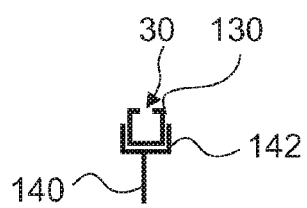 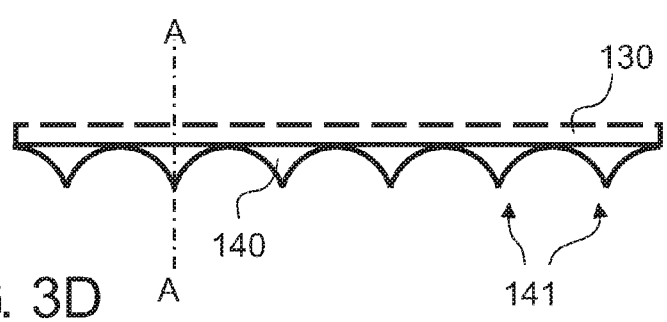
FIG. 3C  FIG. 3D
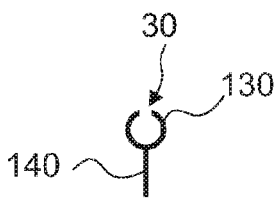 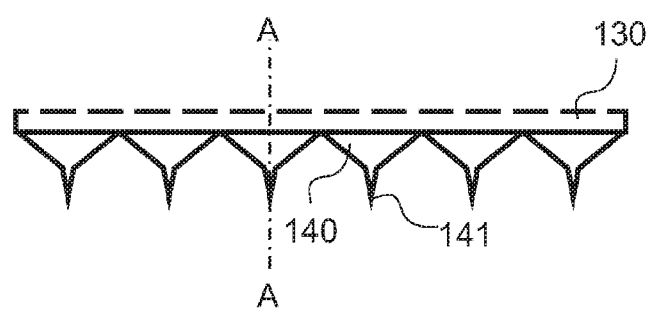
FIG. 3E  FIG. 3F

GAS SYSTEM FOR REACTIVE DEPOSITION PROCESS

TECHNICAL FIELD OF THE INVENTION

Embodiments of the present invention relate to gas lance units for providing gas for a reactive deposition process, reactive deposition apparatuses and methods of reactive deposition. Embodiments of the present invention particularly relate to a gas lance unit configured for a reactive deposition process with a plurality of spaced apart crucibles, an evaporation apparatus for a reactive deposition process, and a method of operating an evaporation apparatus.

BACKGROUND OF THE INVENTION

Processing of flexible substrates, such as plastic films or foils, is in high demand in the packaging industry, semiconductor industries and other industries. Processing may consist of coating of a flexible substrate with a desired material, such as a metal, in particular aluminum. Systems performing this task generally include a processing drum, e.g., a cylindrical roller, coupled to a processing system for transporting the substrate and on which at least a portion of the substrate is processed. Roll-to-roll coating systems can, thereby, provide a high throughput system, e.g. for the packaging industry. For example, transparent layers as barriers for oxygen or water vapor can be deposited.

Typically, an evaporation process, such as a thermal evaporation process, can be utilized for depositing thin layers of metals, which can be metallized onto flexible substrates, such as plastic or pre-coated paper. However, evaporation processes can also be used in other deposition apparatus for non-flexible substrates, such as glass substrates, metal substrates, wafers, or the like.

Metal oxide layers can, for example, be evaporated with the reactive evaporation process. Thereby, the metal is evaporated and the reactive gas, such as oxygen, is provided in the vapor of the metal. This evaporation method can, for example, be used for depositing aluminum oxide, aluminum nitride, aluminum oxynitride, and corresponding materials of other materials on substrates. Thereby, oxygen or the like is preferably provided directly in the vapor of aluminum. In light of the fact that aluminum vapor is highly reactive and aggressive and in light of the fact that the reactive gas needs to be guided close to the aluminum vapor or even within the cloud of aluminum vapor, there is a plurality of difficulties. Even though these difficulties might be particularly crucial for reactively depositing aluminum oxide, similar difficulties might occur for other deposition processes where metals or other materials are reactively deposited as oxides, nitrites or other forms. Typical further materials can be Bi, Zn, Sn, In and Ag.

In view of the above, it is an object to provide an improved gas lance unit, an improved evaporation apparatus and an improved evaporation process to overcome at least some of the problems in the art.

SUMMARY OF THE INVENTION

In light of the above, a gas lance unit, an evaporation apparatus and a method are provided. Further aspects, advantages, and features of the present invention are apparent from the dependent claims, the description, and the accompanying drawings.

According to one embodiment, a gas lance unit configured for a reactive deposition process with a plurality of spaced apart crucibles, wherein spaces are provided between the crucibles, is provided. The gas lance unit includes a gas guiding tube having one or more outlets for providing a gas for the reactive deposition process, and a condensate guiding element for guiding a condensate, particularly an aluminum condensate, to one or more positions above the spaces.

According to another embodiment, an evaporation apparatus for a reactive deposition process is provided. The evaporation apparatus includes a plurality of supports for a plurality of spaced apart crucibles, wherein spaces are provided between the crucibles, a deposition surface for depositing a material onto a substrate provided on the deposition surface, and a gas lance unit. The gas lance unit includes a gas guiding tube having one or more outlets for providing a gas for the reactive deposition process, and a condensate guiding element for guiding a condensate, particularly an aluminum condensate, to one or more positions above the spaces. Thereby, the gas lance unit is provided below the deposition surface and has a length extending in a first direction.

According to a further embodiment, a method of operating an evaporation apparatus is provided. The method includes evaporating a material in a plurality of spaced apart crucibles towards a deposition surface, wherein spaces are provided between the crucibles, guiding a gas into the vapor between the crucibles and the deposition region with a gas guiding tube, and guiding condensate of the vapor to positions above the spaces.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIGS. 3A to 3F show schematic views of gas lance units according to embodiments described herein;

DETAILED DESCRIPTION OF EMBODIMENTS

Reference will now be made in detail to the various embodiments of the invention, one or more examples of which are illustrated in the figures. Within the following description of the drawings, the same reference numbers refer to the same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

According to some embodiments, evaporation processes and evaporation apparatus for layer deposition on substrates, for example on flexible substrates, are provided. Thereby, flexible substrates can be considered to include inter alia films, foils, webs, strips of plastic material, metal or other materials. Typically, the terms "web", "foil", "strip", "substrate" and the like are used synonymously. According to some embodiments, components for evaporation processes, apparatuses for evaporation processes and evaporation processes according to embodiments described herein can be provided for the above-described flexible substrates. However, they can also be provided in conjunction with non-flexible substrates such as glass substrates or the like, which are subject to the reactive deposition process from evaporation sources.

Figure 1:
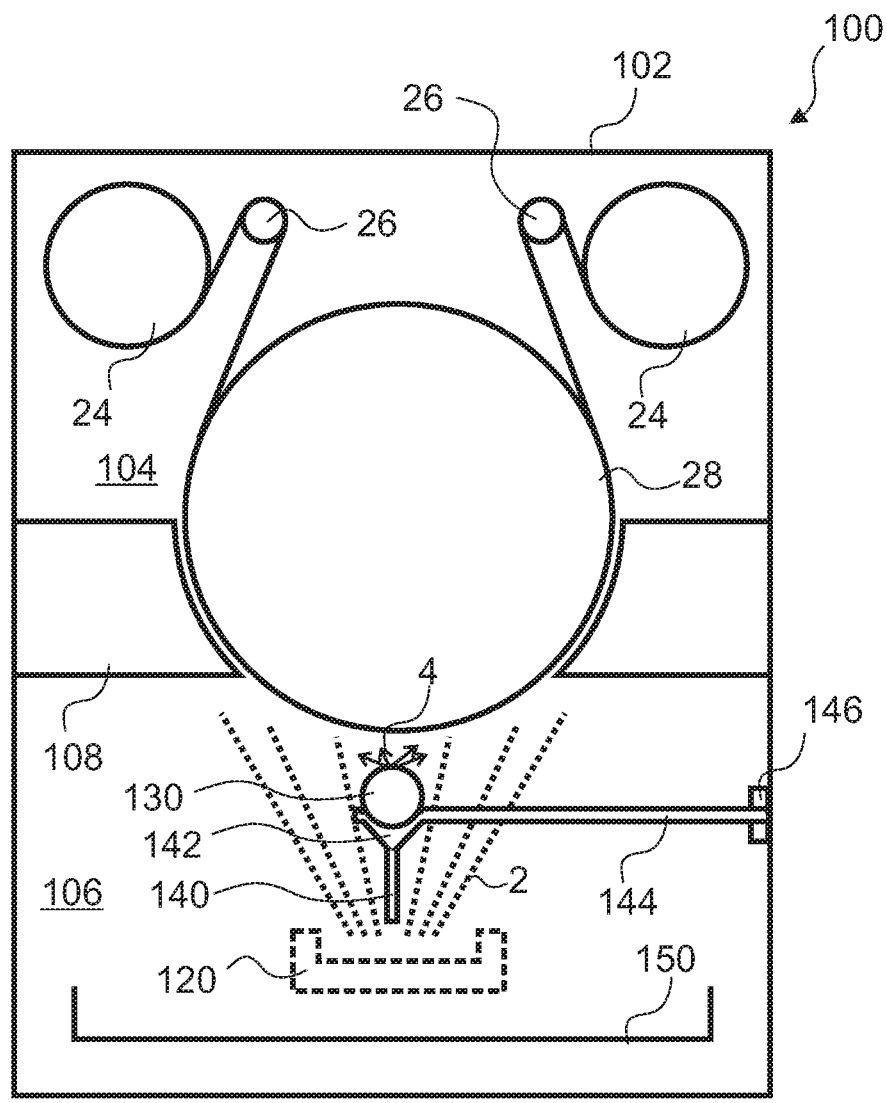
FIG. 1 shows a schematic side view of an evaporation apparatus having a gas lance unit according to embodiments described herein.

FIG. 1 shows an evaporation apparatus 100 having a chamber 102. The chamber 102 is separated by a chamber separation unit 108, such as a chamber separation bracket, in the deposition chamber 106 and a further chamber 104. The further chamber can be a winding chamber which is configured for winding and unwinding of the flexible substrate 1. As shown in FIG. 1, the flexible substrate 1 can be provided from an unwinding roller 22 and can be wound onto a winding roller 24. The substrate is guided by a plurality of further rollers 26 over a processing drum 28. According to typical embodiments, the processing drum 28 can be a cooling drum, wherein the substrate 1 is cooled during processing in a processing area within the deposition chamber 106.

Exemplary embodiments of systems and methods for processing a substrate are described above in detail. The systems and methods are not limited to the specific embodiments described herein, but rather, components of the systems and/or steps of the methods may be utilized independently and separately from other components and/or steps described herein. For example, different combinations of web guiding rollers, such as STS rollers and spreader rollers, may be disposed upstream of the first roller and processing drum.

A vacuum chamber portion within the processing chamber may be provided with an entrance adapted for facilitating the introduction of substrate into the chamber while a vacuum condition is maintained therein. Alternatively, the entire roll-to-roll system, including unwinding and winding rollers, may be contained in vacuum chamber.

In the exemplary embodiment, coating unit is provided for coating flexible substrate with a film of a coating material, so that a flexible substrate can be manufactured. According to different embodiments, which can be combined with any of the embodiments described herein, the coating can be a thermal evaporation or an electron beam evaporation. Coating unit may consist, for example, of staggered boat evaporators for facilitating an improved uniformity of the coated layer.

Within the processing chamber 106 a plurality of crucibles 120 are provided for evaporating a material, such as aluminum, bismuth, zinc, tin, indium, silver, alloys of these materials, or the like. In FIG. 1, the crucible 120 is illustrated with dashed lines in order to illustrate that the crucible is not provided in the cross-section illustrated in FIG. 1. This will be described in further detail with respect to FIG. 2 below. A gas guiding tube 130 is provided below that processing drum 28 and above the crucible 120. Thereby, the reactive gas 4, such as oxygen, can be directly guided into the processing area where the material vapor is provided. Typically, the gas guiding tube has one or more openings directing the reactive gas towards the deposition area in which the material is deposited on the substrate 1.

However, the gas guiding tube 130 is typically at a lower temperature than the evaporation temperature of the material to be deposited and, thus, a condensate of the material to be deposited can occur at the gas guiding tube 130. After some time of operation, the condensate of the evaporated material will start to drip down. Typically, for an evaporation process where a plurality of crucibles are utilized, dripping of the condensate into the crucible results in undesired deviations of the evaporation rate and, thus, in the layer thickness of the layer deposited on the substrate. A condensation on the gas guiding tube might also occur for other deposition processes. However, deposition processes with a large reservoir of material to be deposited generally have fewer deviations in evaporation rate because of the larger amount of liquid material, such as liquid aluminum. Accordingly, the formation of condensate at the gas guiding tube and dripping of the condensate needs to be particularly avoided for evaporation processes from a plurality of crucibles, wherein the limited amount of aluminum is evaporated in each crucible.

In light of the above, according to embodiments described herein, a gas lance having the gas guiding tube 130 and the condensate guiding element 140 is provided. The condensate guiding element 140 is provided at least partially below the gas guiding tube 130. For example, the condensate guiding element 140 can be partially or completely provided between the gas guiding tube 130 and the crucible 120. As shown in FIG. 1, the gas guiding tube support 142 is provided. Thereby, the gas lance unit can be supported with bar 144 at the holding member 146. Accordingly, the bar 144 and/or the gas lance unit can be supported with respect to a position of the chamber 102.

Figure 2:
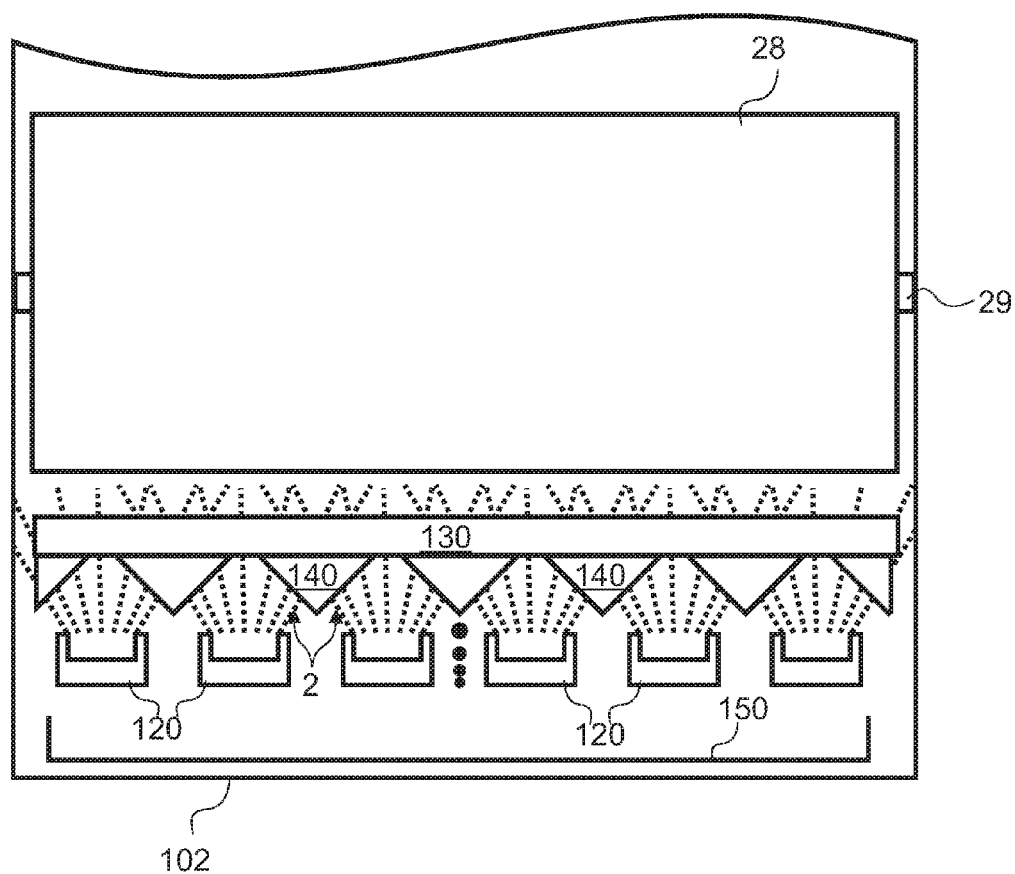
FIG. 2 shows another schematic side view of an evaporation apparatus having a gas lance unit according to embodiments described herein.

The side view shown in FIG. 2 illustrates further details of the condensate guiding element 140. The condensate guiding element 140 is provided fully or at least partially below the gas guiding tube 130 and has protrusions 141. Thereby condensate formed on the gas guiding tube 130 and on the condensate guiding element 140 is guided towards the protrusions 141. The protrusions 141 are, during operation, positioned above or in-between spaces between the crucibles 120. Typically, the gas guiding tube and the condensate guiding element will have, during operation a temperature above the melting temperature and below the evaporation temperature of the material. Accordingly, the condensate of the material can flow towards the protrusions 141. Thus, condensate of the material to be deposited drips between the crucibles and can be, for example, collected in the condensate box 150. Thereby, dripping of condensate of deposited material does not occur into the crucibles 120 and the melted material therein. Accordingly, the deposition rate of the crucible is not influenced and/or splashing of liquid material can be avoided.

As can be seen in FIG. 2 the processing drum 28 can be rotated around the shaft 29 during processing in order to transport the substrate through the deposition region wherein vapor material 2 from the crucibles 120 is provided after reaction with the gas from the gas inlet tube 130 on the substrate. According to typical embodiments, the processing drum length is of at least 105% of the substrate width.

According to typical embodiments, a flexible substrate includes, but is not limited to a CPP film (i.e., a casting polypropylene film), an OPP film (i.e., an oriented polypropylene film), or a PET film (i.e., an oriented polyethylene terephthalate film). Alternatively, the flexible substrate may be a pre-coated paper, a polypropylene (PP) film, a PEN film, a poly lactase acetate (PLA) film, or a PVC film. According to typical embodiments, the flexible substrate has a thickness below 50 µm or, more specifically, 5 µm or, even more specifically 2 µm. For example, the flexible substrate may be a 20 µm OPP substrate or a 12 µm PET substrate. Embodiments described herein also contemplates that the flexible substrate is an ultra thin film having a thickness of 2 µm or below, e.g., 0.7 µm. According to typical embodiments, the elements of the system are appropriately configured depending on the flexible substrate, so that the substrate can be processed as described herein.

According to typical embodiments, aluminum can be provided in the crucibles 120. The aluminum can, for example, be evaporated by thermal evaporation or by electron beam evaporation. The aluminum vapor is indicated by reference numeral 2. In light of the fact that the temperature of the gas guiding tube 130 and the condensate guiding element 140 is below the evaporation temperature of aluminum, aluminum will condensate at the gas lance unit. Further in light of the fact that the temperature of the gas lance unit is above the melting temperature, the aluminum can flow towards the protrusions of the triangular shape portions of the condensate guiding element such that the condensate can drip into the condensate box 150. The protrusions are positioned above the spaces between the crucibles 120. Thereby, dripping of the condensate does not influence the evaporation within the crucibles 120.

According to typical embodiments described herein, the gas lance unit 130 is provided within the vapor cloud. Thereby, a significant portion of the reactive gas, such as oxygen, can be bound in the process. Accordingly, a relatively low process pressure can be provided within the chamber. According to typical embodiments, which can be combined with other embodiments described herein, the process pressure of $1*10^{-3}$ mbar or below, for example of $1*10^{-4}$ mbar or below can be provided. The comparable low chamber pressure can result in improvement of the barrier properties, e.g. during deposition of a transparent layer for packaging applications or the like. Accordingly, embodiments described herein can be utilized for transparent barrier layers with optical transmissions, e.g. at a wavelength of 400 nm to 700 nm, between 10% and 100%.

FIGS. 3A to 3F illustrate the typical embodiments of gas lance units as described herein. As shown in FIGS. 3A and 3B the gas lance unit 130 can have an essentially round cross-section with openings 30 for guiding the reactive gas within or towards the processing region. According to typical embodiments, which can be combined with other embodiments described herein, the reactive gases can be selected from the group consisting of: oxygen, nitrogen, $NH_3$, and combinations thereof. According to yet further embodiments, additional gases, typically inert gases such as argon can be added to a gas mixture comprising the reactive gas. Thereby, typically the amount of reactive gas can be more easily controlled.

The condensate guiding element 140 can have a plurality of triangular shaped elements forming protrusions. Typically, the triangular portions can be isosceles triangles. FIG. 3A is a cross-section at the position A-A of FIG. 3B. A gas guiding tube support member 142 is provided for having the gas guiding tube 130 supported therein. Further, the gas guiding tube can be fixed to the gas lance unit with the fixation element 342 at one or more positions of gas lance unit. In the gas guiding tube 130 openings 30 are provided for providing the reactive gas, such as oxygen, to different positions along the gas guiding tube 130.

As compared to the FIGS. 3A and 3B the gas lance unit shown in FIG. 3C has a rectangular cross-section of the gas guiding tube 130. The condensate guiding element 140 includes a plurality of protrusions 141, which can for example be the tip portion of several recesses formed by concave sections. The protrusions can also be portions of wavelike shapes. The gas lance unit includes a gas guiding tube support 142 wherein the gas guiding tube 130 is supported. Condensate formed during operation can be guided towards the tip portions 141. The condensate can drip from the tip portions, which are configured for being positioned above spaces between crucibles, downward without having condensate dripping in the crucible. Dripping in the crucible could result in fluctuations of the evaporation rate and/or splattering of liquid aluminum within the apparatus.

The gas lance unit illustrated with respect to FIGS. 3D and 3F has a condensate guiding elements 140 with peak section 341 forming protrusions. The condensate guiding element is fixed to the lower portion of the gas guiding tube 130.

According to some embodiments described herein, the gas lance unit can be formed by having a tube or a pipe. In a lower section of the gas lance unit, a condensate guiding elements with protrusions is provided. The condensate guiding element can be provided as a draining sheet for guiding the condensate in liquid form to predetermined positions. The protrusions or peaks of the draining sheet are configured for having positions during operation above or within spaces formed between respective ones of a plurality of crucibles. Since, during operation, the temperature of the gas lance unit is typically above the melting temperature of the material to be evaporated, e.g. aluminum, the liquid material is guided away from the center positioned above the crucible and, thus, a center position of the vapor cloud of the respective crucible. The excess material can drip in the spaces between the crucibles, for example in a condensate box below the crucibles, without having droplets effecting the operation of the crucibles.

As described herein, the gas lance unit typically includes a gas guising tube and a condensate guiding element, such as a draining sheet for guiding condensate of the material towards predetermined position, which avoid dripping of condensate in the evaporation crucibles. Typically, the condensate guiding element and a tube support member can be formed integrally, e.g. welded together. The gas guiding tube can be supported by the support element and can, for example, be held by fixing members, see, e.g. fixing member 342, which can be welded to the tube support member. Fixation means other than welding can alternatively or additionally be provided. However, it has to be considered that regular maintenance should be simplified. If for example aluminum is evaporated, the aluminum vapor is highly aggressive and a gas tube will have a life cycle of a few days to a few weeks. For example, the gas guiding tube might need to be replaced every 0.5 to 2 weeks, e.g. every week. Further, the draining sheet needs to be replaced about every 1 to 4 weeks, e.g. every two weeks. Fixation means need to be provided in order to last at least a corresponding time period. During maintenance the gas lance unit can for example be removed from the processing chamber. The fixing member 342 can be un-welded and gas guiding tube can be removed from the gas guiding tube support. Thereafter a new gas guiding tube can be fixed to the gas guiding tube support and the gas lance unit including the draining sheet, the support and the gas guiding tube can be re-inserted in the deposition chamber. During a subsequent maintenance step both the gas guiding tube and the draining sheet can be replaced. In light of the rough operation conditions in the evaporation area, the gas guiding tube, the draining sheet, i.e. a condensate guiding element, and the support for the gas guiding tube can be made from a material selected from the group consisting of: steel, stainless steel, copper, titanium, tantalum, niobium, and combinations thereof.

Figure 4A:
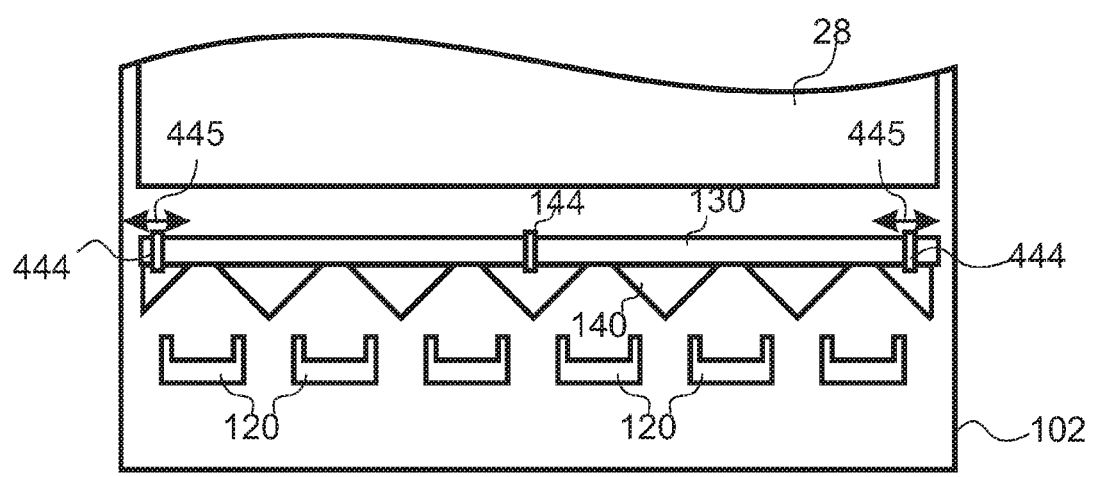
FIGS. 4A and 4B illustrate adaptation of gas lance units according to embodiments described herein to operation conditions of an evaporation apparatus.
Figure 4B:
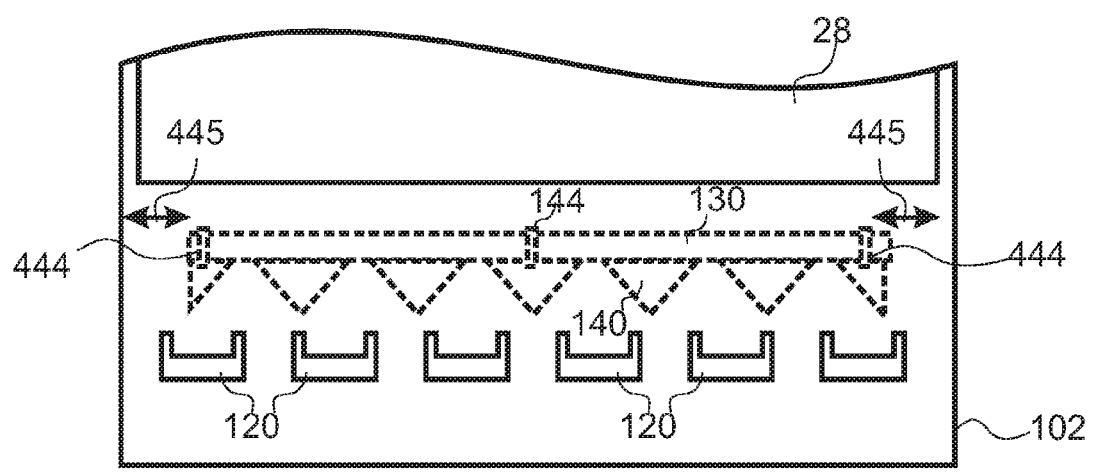

A further aspect of embodiments of the present invention is illustrated with respect to FIGS. 4A and 4B. As previously shown in FIG. 1, the gas lance unit can be supported by a bar 144, which is fixed to a holding member 146. The holding member can be arranged at a chamber housing portion or at a frame within the chamber. According to typical embodiments, the temperature in the deposition region can be in a range of 400° C. to 1000° C. Accordingly, the temperature of the gas lance unit during operation can be in a range of 400° C. to 800° C. Thereby, an elongation of the gas lance unit can occur. According to typical implementations, the elongation can be from 1% to 4%. A gas lance unit of about 2.5 m can, thus, change its length by about 3 cm to 10 cm.

FIG. 4A illustrates a portion of an evaporation apparatus. The lower portion of the processing drum 28 is seen. Further, crucibles 120 are provided within the chamber 102 below the processing drum 28. The gas guiding tube 130 and the condensate guiding element 140 is provided below the processing drum and above the crucibles. FIG. 4A shows a first holding member 144 and further holding members 444. The first holding member is arranged essentially at a center position. According to typical embodiments, it can be arranged in the center third portion of the length of the gas lance unit. As indicated by arrows 445, the outer holding members can move in the direction of the longer axis of the gas lance unit. As described with respect to FIG. 1, the holding members can typically have a bar and a member for fixing the bar to a housing portion or a frame portion.

Within FIG. 4A, the apparatus is shown under operation conditions. Thereby, the protrusions are positioned essentially above spaces between respective two of the plurality of crucibles 120. FIG. 4A shows the system in a condition, wherein the gas lance unit is provided at room temperature. Thereby, the gas lance unit is shorter as compared to the high temperature operation condition such that some of the protrusions can in a cool state in fact be positioned above a crucible. In order to minimize this effect it is beneficial to provide as fixed support close to the center of the gas lance unit and to have outer supports movable along the direction of the length of the unit.

The embodiments described above mainly referred to roll-to-roll processing of flexible substrates, where a reactive evaporation process is provided below a processing drum. In light of the temperatures for evaporation, typically a cooled processing drum can be utilized. Thereby, barrier layer of e.g. $Al_2Ox$ can be provided on foils, webs, films, coated paper or other flexible substrates. This is typically useful for inline-barrier coating, e.g. packaging applications. However, embodiments according to the invention can also be applied for other reactive deposition processes. For example coating of glass substrates or other substrates with oxides, nitrides, oxynitrides of evaporated materials can also utilize embodiments described herein. Typically, the embodiments can be used for evaporation of materials like metals, where a reactive gas is provided with a gas assembly in the cloud of vapor, i.e. a gas assembly is positioned above an evaporator.

Figure 5:
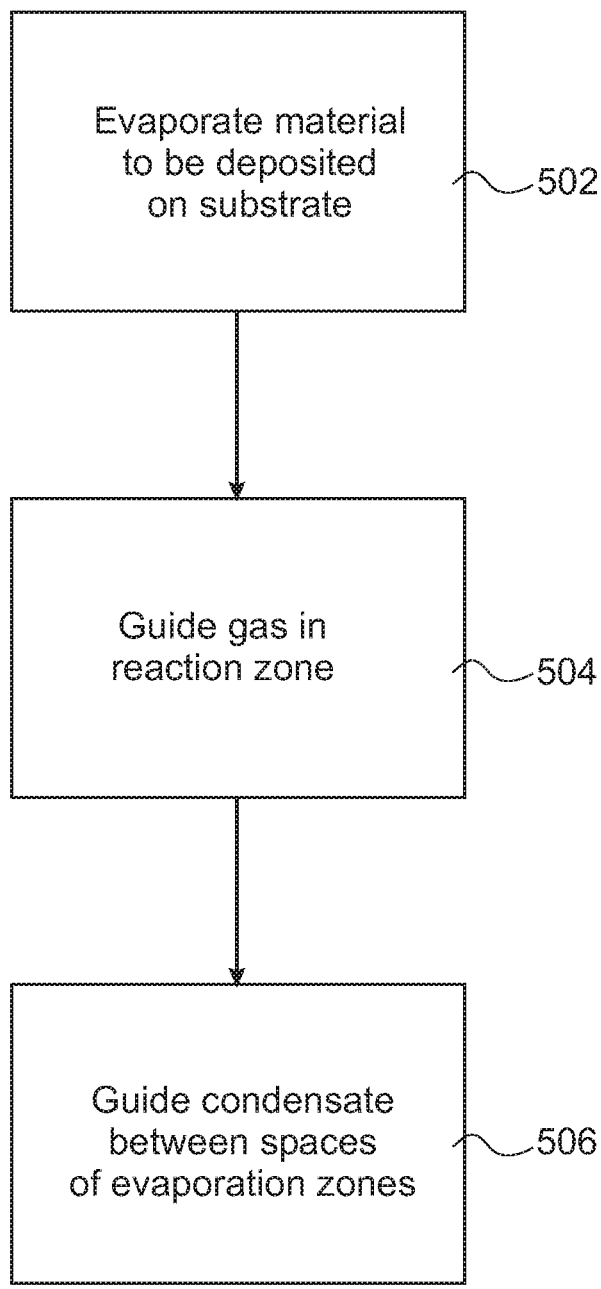
FIG. 5 shows a flow chart of a method of reactively depositing a material according to embodiments described herein.

According to yet further embodiments, methods of operating an evaporation apparatus, particularly for a reactive evaporation process are provided. An exemplary flow chart is shown in FIG. 5. In step 502, material to be deposited on a substrate is evaporated. Specifically, the material can be deposited in a plurality of spaced apart crucibles or such that there are spaces between evaporation zones. In step 504a reactive gas, e.g. oxygen is guided in a reaction zone for reacting with the evaporated material. The reactive gas is guided with a gas guiding tube, which is at least partly positioned above the crucibles. In step 506, condensate, which is formed on the gas guiding tube or another component corresponding to the gas guiding tube, i.e. elements of a gas lance unit, is guided to positions which correspond to the spaces between the evaporation zones.

The condensate is guided such that no dripping into the evaporation zones can occur or such that dripping in the evaporation zones is reduced. Typically, protrusions for dripping are provided above the spaces between the crucibles. According to other embodiments, the protrusions can also extend downward in-between the spaces or even below the crucibles. According to embodiments described herein, condensate of the evaporated material is guiding to positions such that dripping of condensate in the evaporations zones can be avoided or reduced.

While the foregoing is directed to embodiments of the invention, other and further embodiments of the invention may be devised without departing from the basic scope thereof, and the scope thereof is determined by the claims that follow.

The invention claimed is:

1. An evaporation apparatus for a reactive deposition process, comprising:
   a plurality of supports for a plurality of spaced apart crucibles, wherein spaces are provided between the crucibles;
   a deposition surface for depositing a material onto a substrate provided on the deposition surface; and
   a gas lance unit, wherein the gas lance unit is provided below the deposition surface and has a length extending in a first direction, and wherein the gas lance unit comprises:
      a gas guiding tube having one or more outlets for providing a gas for the reactive deposition process; and
      a condensate guiding element in contact with the gas guiding tube, wherein the condensate guiding element comprises protrusions at one or more positions above the spaces between the crucibles for guiding a condensate formed on the gas guiding tube and on the condensate guiding element to the one or more positions above the spaces.

2. The apparatus according to claim 1, wherein the deposition surface is the surface of a coating drum having a rotation axis extending essentially in the first direction, and wherein the one or more positions are provided essentially along the first direction.

3. The apparatus according to claim 1, wherein the gas lance unit is supported at a mounting support which is provided in the middle area of the gas lance unit with respect to the first direction.

4. The apparatus according to claim 1, wherein one or more of the one or more positions are offset with respect to the corresponding spaces at room temperature.

5. The apparatus according to claim 1, further comprising:
a condensate box provided below the plurality of supports for the plurality of spaced apart crucibles and being configured for collecting dripping condensate during operation.

6. The unit according to claim 3, wherein the mounting support is provided essentially in the center of the gas lance unit with respect to the first direction.

7. The apparatus according to claim 1, wherein the condensate guiding element is provided at least partially below the gas guiding tube.

8. The apparatus according to claim 1, wherein the condensate guiding element further comprises:
a gas guiding tube support such that the gas guiding tube is supported upon the condensate guiding element.

9. The apparatus according to claim 1, wherein the entire condensate guiding element is above the spaces between the crucibles.

\* \* \* \* \*